United States Patent
Ioffe

(10) Patent No.: US 10,880,020 B2
(45) Date of Patent: Dec. 29, 2020

(54) UE TESTING SYSTEM FOR RF CHARACTERISTICS FOR THE NEW RADIO STANDARD

(71) Applicant: Apple Inc., Cupertino, CA (US)

(72) Inventor: Anatoliy Ioffe, Beaverton, OR (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/467,102

(22) PCT Filed: Dec. 29, 2017

(86) PCT No.: PCT/US2017/069120
§ 371 (c)(1),
(2) Date: Jun. 6, 2019

(87) PCT Pub. No.: WO2018/128950
PCT Pub. Date: Jul. 12, 2018

(65) Prior Publication Data
US 2019/0393968 A1    Dec. 26, 2019

Related U.S. Application Data

(60) Provisional application No. 62/443,420, filed on Jan. 6, 2017.

(51) Int. Cl.
*H04B 17/15* (2015.01)
*H04B 17/29* (2015.01)

(52) U.S. Cl.
CPC ............. *H04B 17/15* (2015.01); *H04B 17/29* (2015.01)

(58) Field of Classification Search
CPC ...................................................... H04B 17/15
See application file for complete search history.

(56) References Cited

U.S. PATENT DOCUMENTS

| | | | | |
|---|---|---|---|---|
| 2004/0005890 A1* | 1/2004 | Holma | ................ | H04W 36/30 |
| | | | | 455/424 |
| 2005/0174294 A1* | 8/2005 | Peroulis | ................ | H01Q 9/14 |
| | | | | 343/746 |
| 2006/0194553 A1* | 8/2006 | Ozaki | ................ | G01R 29/10 |
| | | | | 455/226.1 |
| 2007/0207756 A1* | 9/2007 | Qi | ................ | H04B 17/29 |
| | | | | 455/226.1 |

(Continued)

FOREIGN PATENT DOCUMENTS

| | | |
|---|---|---|
| EP | 3104539 A1 | 12/2016 |
| EP | 3182144 A1 | 6/2017 |

(Continued)

OTHER PUBLICATIONS

International Search Report and Written Opinion dated Aug. 30, 2018 for PCT Application PCT/US2017/069120.

*Primary Examiner* — Hsinchun Liao
(74) *Attorney, Agent, or Firm* — Eschweiler & Potashnik, LLC

(57) ABSTRACT

A testing system and method, for testing wireless communication devices, may include an anechoic far field chamber with a dual-axis positioning system for rotating the device under test. The testing system may further include a measuring antenna and a number of link antennas distributed throughout the testing system. A number of receive (RX) and transmit (TX) testing configurations for 5G NRs, using the testing system, are described in detail.

20 Claims, 13 Drawing Sheets

(56) References Cited

U.S. PATENT DOCUMENTS

| | | | |
|---|---|---|---|
| 2010/0045543 A1* | 2/2010 | Kitada | G01R 29/105 343/703 |
| 2010/0278059 A1* | 11/2010 | Wu | H04B 7/0413 370/252 |
| 2011/0084887 A1 | 4/2011 | Mow et al. | |
| 2014/0098846 A1 | 4/2014 | Emmanuel et al. | |
| 2015/0171955 A1* | 6/2015 | Olesen | H04B 7/265 370/252 |

FOREIGN PATENT DOCUMENTS

| | | |
|---|---|---|
| WO | 2006/047677 A1 | 5/2006 |
| WO | 2016/16154 A1 | 10/2016 |

* cited by examiner

UE TESTING SYSTEM FOR RF CHARACTERISTICS FOR THE NEW RADIO STANDARD

RELATED APPLICATIONS

This application is a National Phase entry application of International Patent Application No. PCT/US2017/069120 filed Dec. 29, 2017, which claims priority to U.S. Provisional Patent Application No. 62/443,420, filed on Jan. 6, 2017, entitled "UE ESTING SYSTEM FOR RF CHARACTERISTICS FOR THE NEW RADIO STANDARD" in the name of Anatoliy Ioffe and is hereby incorporated by reference in its entirety.

BACKGROUND

An emerging wireless standard for wireless cellular networks is known as 5G New Radio (NR). The specifications for 5G NR are standardized as part of the Third Generation Partnership Project (3GPP) specifications with a goal of making wireless broadband performance comparable to that of wireline network connectivity. In 5G NR, a new Radio Access Technology (RAT), beyond the Long Term Evolution (LTE) standard, is used. The 5G RAT may be operable over a wide range of frequency bands, including from less than 6 GHz, to millimeter wave (mmWave) bands, to as high as 100 GHz.

With respect to the frequency coverage of a 5G RAT device, the 5G RAT devices that operate at high-frequencies (e.g., devices operating above 6 GHz) may include highly integrated architectures that may feature innovative front-end solutions, multi-element antenna arrays, and passive and active feeding networks. These architectures may not allow for the use of the same testing techniques that are currently used to verify Radio Frequency (RF) requirements.

For example, a potential highly integrated 5G device may not be able to physically expose a front-end cable connector to the test equipment: the interface between the front-end and the antenna may be an antenna array feeding network, the interface may be so tightly integrated so as to preclude the possibility of exposing a test connector, etc. However, testing of such devices, such as testing of the devices with respect to various performance metrics, is still desirable.

BRIEF DESCRIPTION OF THE DRAWINGS

Embodiments described herein will be readily understood by the following detailed description in conjunction with the accompanying drawings. To facilitate this description, like reference numerals may designate like structural elements. Embodiments are illustrated by way of example and not by way of limitation in the figures of the accompanying drawings.

DETAILED DESCRIPTION OF PREFERRED EMBODIMENTS

Techniques described herein may relate to a testing framework for the integration 5G RAT devices. The testing framework may be used to test the 5G RAT devices without requiring a cable connector to the devices and may be used for over-the-air testing of the performance of the 5G RAT devices at various frequency bands, testing of the devices with respect to radio resource management (RRM), and testing relating to demodulation performance requirements.

A testing system and method, for testing wireless communication devices, is described. The testing system may include an anechoic far field chamber with a dual-axis positioning system for rotating the device under test. The testing system may further include a measuring antenna and a number of link antennas distributed throughout the testing system. A number of receive (RX) and transmit (TX) testing configurations for 5G NRs, using the testing system, are further described.

Figure 1:
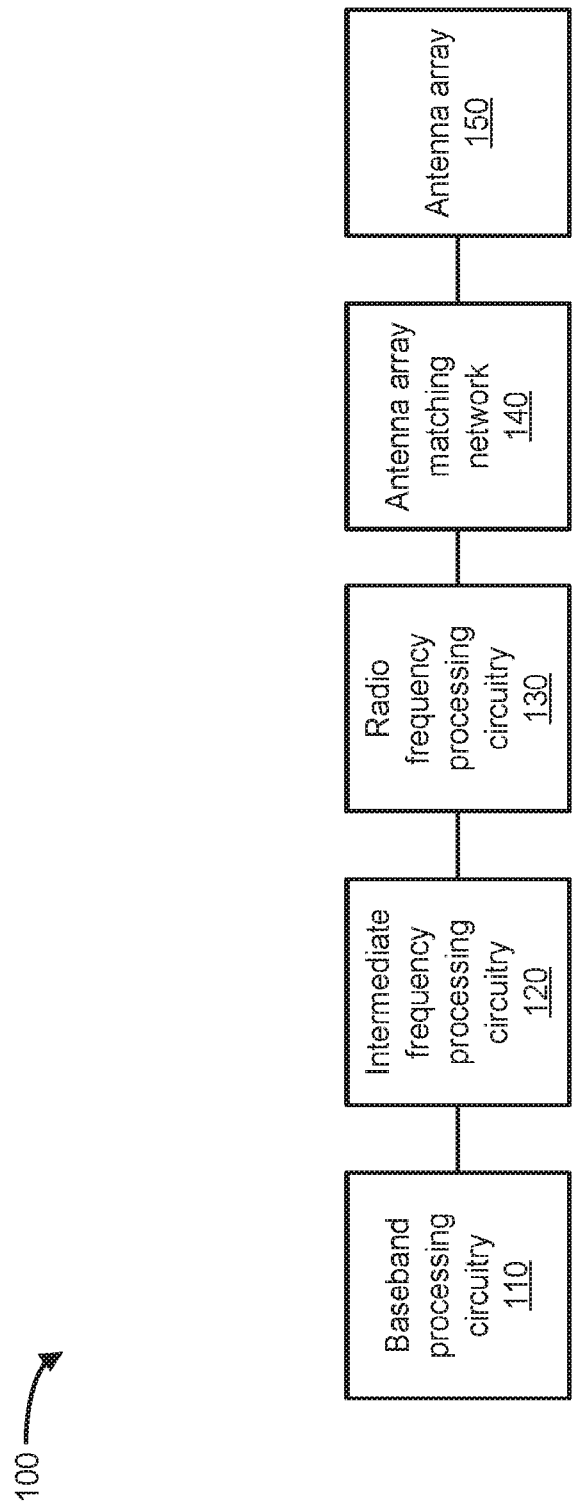
FIG. 1 is a diagram conceptually illustrating an example architecture relating to 5G NR functionality.

FIG. 1 is a diagram conceptually illustrating an example architecture relating to 5G NR functionality. The architecture of FIG. 1 may particularly be useful for a 5G NR transmitter that transmit at frequencies greater than 6 Ghz. The components shown in FIG. 1 may be included in User Equipment (UE) 100. UE 100 may be, for example, a cellular phone (e.g., a smartphone), a Machine-to-Machine (M2M) device, an Internet of Things (IoT) device, a Narrowband IoT (NB-IoT) device, a wearable device, or any other type of communication device designed to include a 5G NR. Because the techniques described herein relate to a testing framework for UE 100, UE 100 may alternatively be referred to herein as the Device Under Test (DUT).

As shown in FIG. 1, the 5G NR functionality of UE 100 may include baseband processing circuitry 110, intermediate frequency processing circuitry 120, radio frequency processing circuitry 130, antenna array matching network 140, and antenna array 150. Baseband processing circuitry 110 may include a device (e.g., a semiconductor chip) that manages radio functions of UE 100. Baseband processing circuitry 110 is described in more detail below with reference to FIGS. 11 and 12. Baseband processing circuitry 110 may include, for example, a real-time operating system (RTOS) that may control timing-dependent radio functions such as signal modulation, encoding, and frequency shifting.

Intermediate frequency processing circuit 120 may perform processing at frequencies between the baseband signal and the final carrier wave frequency. Intermediate frequency processing may include, for example, amplification or other processes. In some implementations, intermediate frequency processing circuit 120 may be omitted or the functionality of intermediate frequency processing circuit 120 may be integrated within baseband processing circuitry 110 or radio frequency processing circuitry 130.

Radio frequency processing circuitry 130 may include the components of UE 100 that process the incoming/outgoing radio frequency signals. Radio frequency processing circuitry 130 may include, for example, RF filters, RD amplifiers, oscillators, mixers, or other radio frequency components.

Antenna array matching network 140 may include circuitry to operate as an antenna tuner to, for example, improve power transfer between antenna array 150 and radio frequency processing circuitry 130 by matching the impedance. Antenna array 150 may include two or more antennas that can be controlled to operate as a single antenna. The individual antenna elements may be coupled to radio frequency processing circuitry 130 and antenna array matching network 140 by a number of feedlines. The antenna array matching network may also include amplitude and phase control of each feedline, thereby implementing beam forming of the transmitted and received signals.

Figure 2:
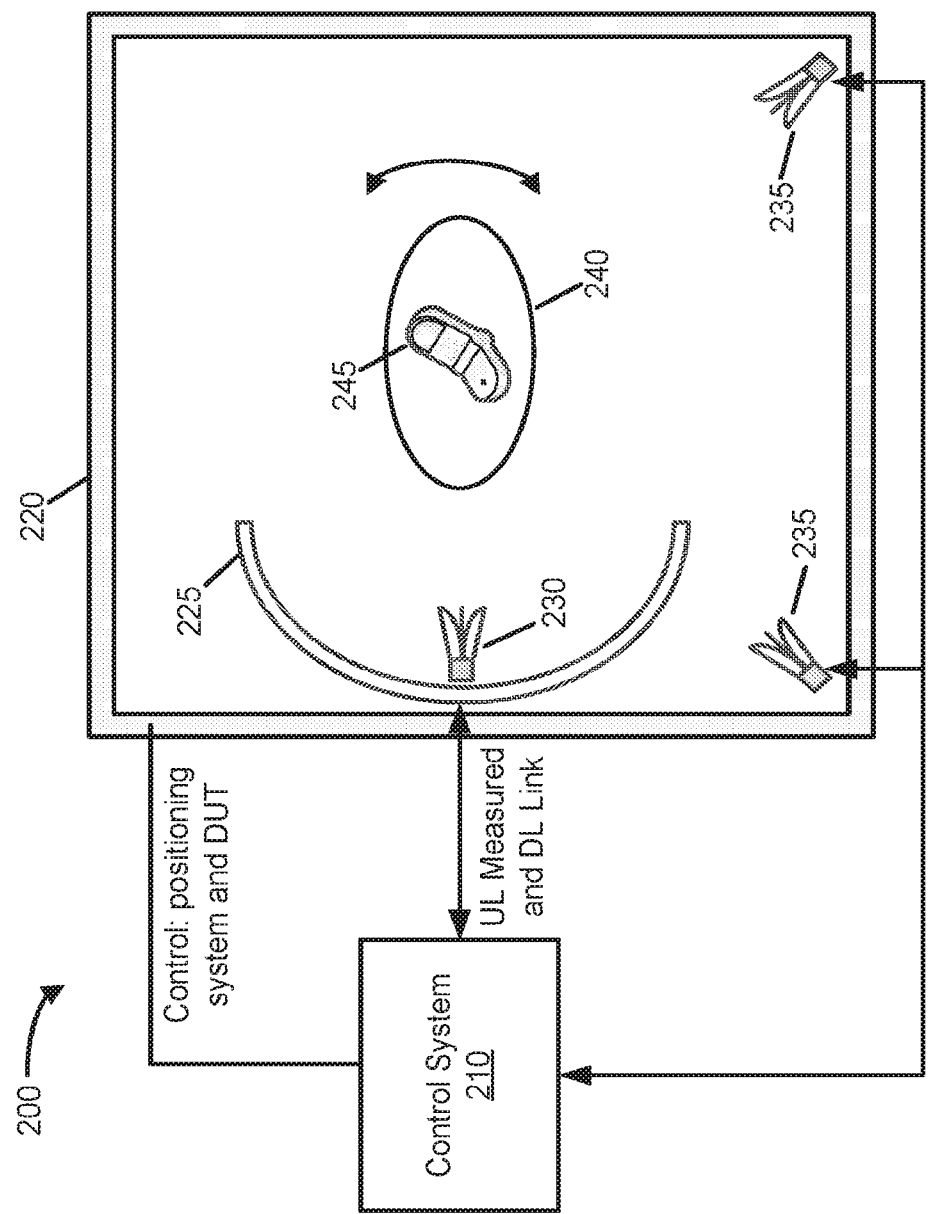
FIG. 2 is a diagram illustrating a testing system for testing the transmitting of data for a Device Under Test (DUT)

FIG. 2 is a diagram illustrating a testing system 200 for a DUT (e.g., UE 100). System 200 may test the DUT as the transmitter. As shown, system 200 includes control system 210 and anechoic chamber 220. Control system 210 may include a computing device, such as a computer, for running test programs/scripts. Control system 210 may also include measurement devices to measure signals that are received from anechoic chamber 220. The measurement devices may include, for example, devices to measure signal strength, signal quality, signal timing information, etc. Control system may also include devices to control antennas and/or transmitters associated with anechoic chamber 220.

Control system 210 may include a testing interface to DUT 245. For example, DUT 245 may include an interface through which a testing cable may be connected. Alternatively or additionally, control system 210 may transmit control commands to DUT 245 via a wireless test interface. Through the testing interface, control system 210 may control DUT 245 to, for example, operate in a mode in which the UE adaptively optimizes its uplink and/or downlink beam based on the received downlink signals (i.e., the UE dynamically changes the beam forming parameters of the antenna). Alternatively, control system 210 may control DUT 245 to adaptively optimize its beam during an initialization period and then fix its beam for subsequent testing (i.e., the beam forming parameters are held constant).

Anechoic chamber 220 may include a far-field chamber that is internally coated with an anechoic material (relative to radio frequency waves). Although illustrated as a rectangular chamber in FIG. 2, the chamber can be spherical or other shapes. Anechoic chamber 220 may include measuring antenna 225 (i.e., a receiving antenna), and one or more link antennas (i.e., transmitting antennas) 230 and 235. A positioning system 240 may be placed in the center of anechoic chamber 220. When testing a DUT, such as a DUT 245, the DUT may be placed in or on positioning system 240.

Measuring antenna 225 may receive signals from DUT 245 and transmit the signals to control system 210 for sensing and recording. Link antennas 230 and 235, under the control of control system 210, may transmit signals to DUT 245. Link antenna 230 may particularly be positioning centrally with respect to measuring antenna 225 (i.e., it is collocated with respect to measuring antenna 225). In some implementations, measurement antenna 225 and link antenna 230 may be implemented as the same antenna or antenna array. Link antennas 235 may be positioned at various other locations in anechoic chamber 220. Although two link antennas 235 are illustrated in FIG. 2, any number of link antennas may potentially be used.

Positioning system 240 may be used to secure DUT 245 while moving DUT 245 within anechoic chamber 220. In one implementation, positioning system 240 may be a dual-axis positioning system that can rotate DUT 245, with two degrees of freedom, while keeping DUT 245 in the center of anechoic chamber 220. In another possible implementation, positioning system 240 may be implemented with, for example, one degree of freedom.

The test system of FIG. 2 may enable a number of test/measurement configurations relating to testing of the transmissions characteristics of DUT 245. In particular, each of three test/measurement configurations, relating to the system of FIG. 2, will next be described with reference to FIGS. 3-5.

Figure 3:
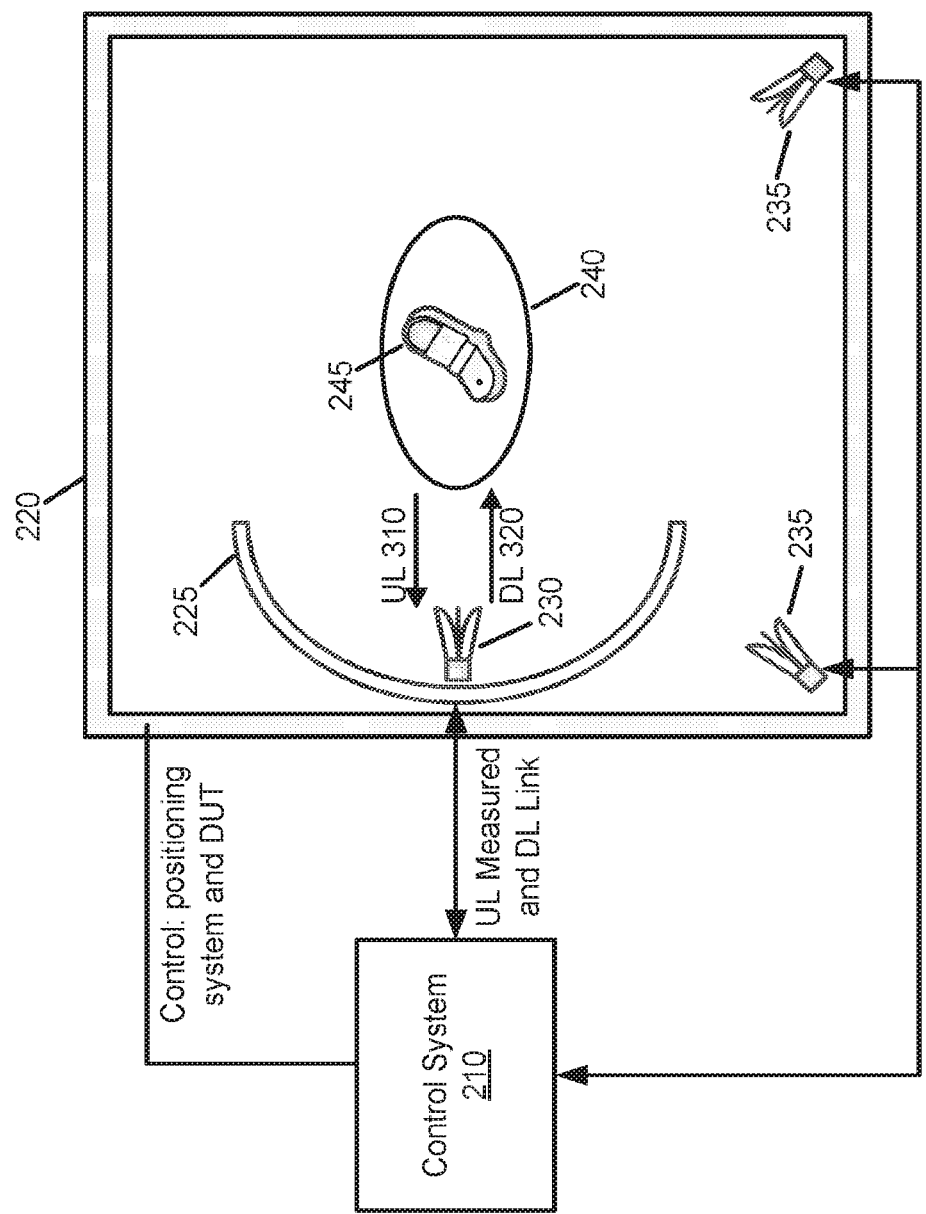
FIGS. 3-5 are diagrams illustrating example testing configurations for the system of FIG. 2.

FIG. 3 is a diagram illustrating a first example configuration of test system 200 for testing UE transmissions. In this embodiment, uplink signals 310 may be transmitted from DUT 245 to measuring antenna 225. The measured signal, received from DUT 245, may be processed and recorded by control system 210. Downlink signals 320 may be transmitted, to DUT 245, via the co-located link antenna 230. Results describing the downlink signals, as measured by DUT 245, may be transmitted back to control system 210 for storage and analysis. The transmission of uplink signals 310, formed over a number of DUT 245 positions (i.e., control system 210 may control positioning system 240 to rotate to a number of predetermined positions, corresponding to different beam angles for DUT 245 with respect to measuring antenna 225 and link antenna 230) may be controlled by control system 210.

With the system of FIG. 3, a number of testing metrics, which may be referred to as figures of merit (FoM) may be measured across a number of DUT 245 positions, which may correspond to a number of beam angles with respect to DUT 245. In one implementation, the FoMs may include: maximum output power of DUT 245, minimum output power of DUT 245, ON/OFF time mask, power control, configured maximum output power (PCMAX), frequency error, Error Vector Magnitude (EVM), and/or Adjacent Channel Leakage power Ratio (ACLR). The ON/OFF time mask FoM may relate to the measurement of UE transmit power during a period, of a particular length, in which the radio of the UE is turned on. The PCMAX FoM may refer to the maximum amount of output power measured for DUT 245. The EVM FoM may refer to a measure of difference between a reference waveform that is transmitted by DUT 245 and the measured waveform (as received an measuring antenna 225). The ACLR FoM may refer to measurements of spectrum leakage to adjacent bands. The FoMs measured with the system of FIG. 3 are further defined in the Third Generation Partnership Project Specifications.

For each required FoM that is to be measured, the set of DUT beam angles and DUT positions may be predefined. For example, Maximum Output Power (MOP) may be evaluated over a larger set of beam angles and positions than other requirements. Some requirements may be evaluated at a single beam angle across a small number of DUT positions.

In some implementations, control system 210 may control DUT 245 to dynamically adapt its beam to the link antenna.

Figure 4:
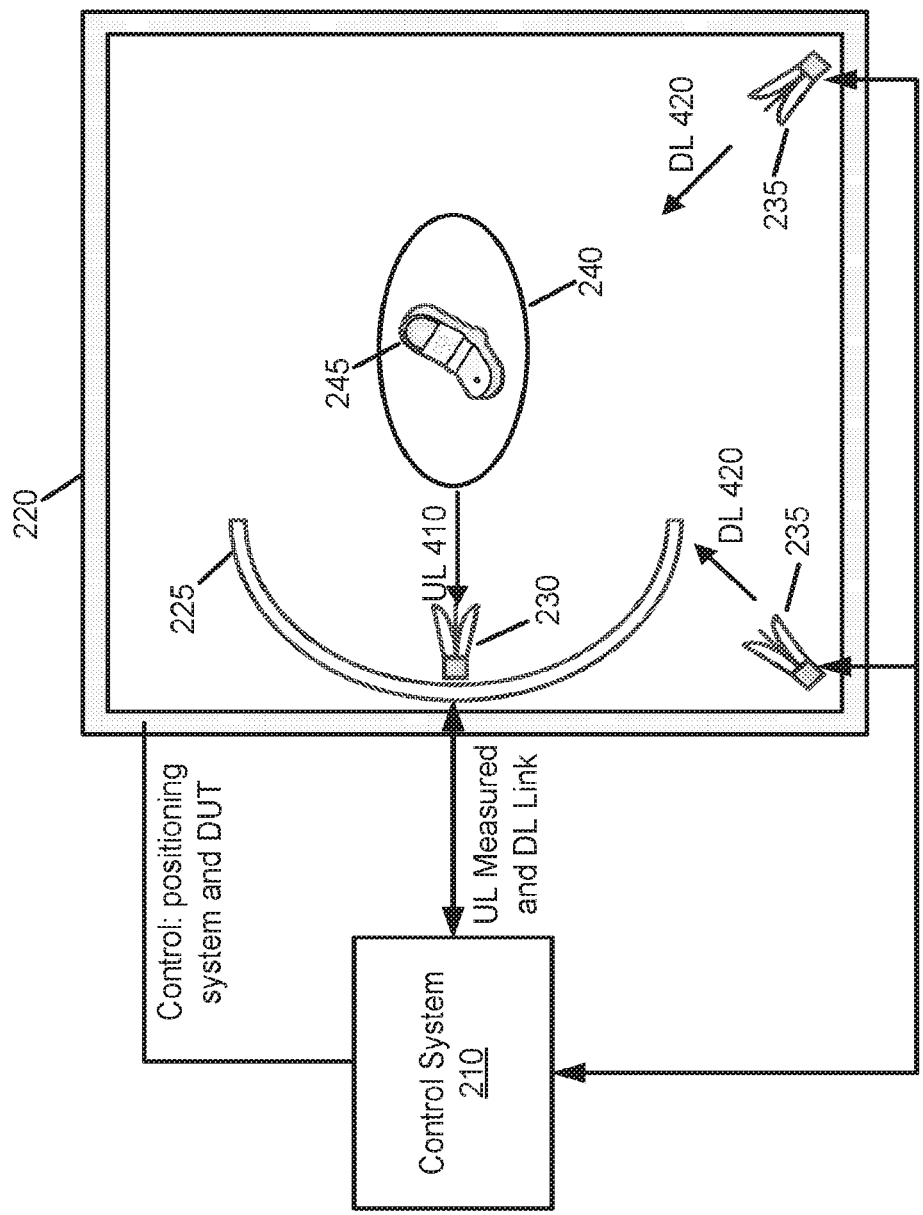

FIG. 4 is a diagram illustrating a second example configuration of test system 200 for testing UE transmissions. In this embodiment, uplink signals 410 may be transmitted from DUT 245 to measuring antenna 225. Downlink signals 420 may be transmitted via one of link antennas 235. Control system 210 may control the transmitting of downlink signals 420, from a number of different link antennas 235, to measure the desired FoMs across a number of DUT beam angles and DUT positions. In some implementations, control system 210 may instruct DUT 245 to dynamically adapt its beam to the activated downlink link antenna. Thus, in this configuration, the DUT transmitted beam angle and the angle of measurement (made by measurement antenna 225) are not the same.

With the system of FIG. 4, the measured FoMs may include the FoMs relating to ACLR and unwanted emissions. A set of DUT beam angles and positions may be defined for each requirement test. Control system may thus control measuring antenna 225, various ones of link antennas 235, and positioning system 240 to satisfy each requirement test.

Figure 5:
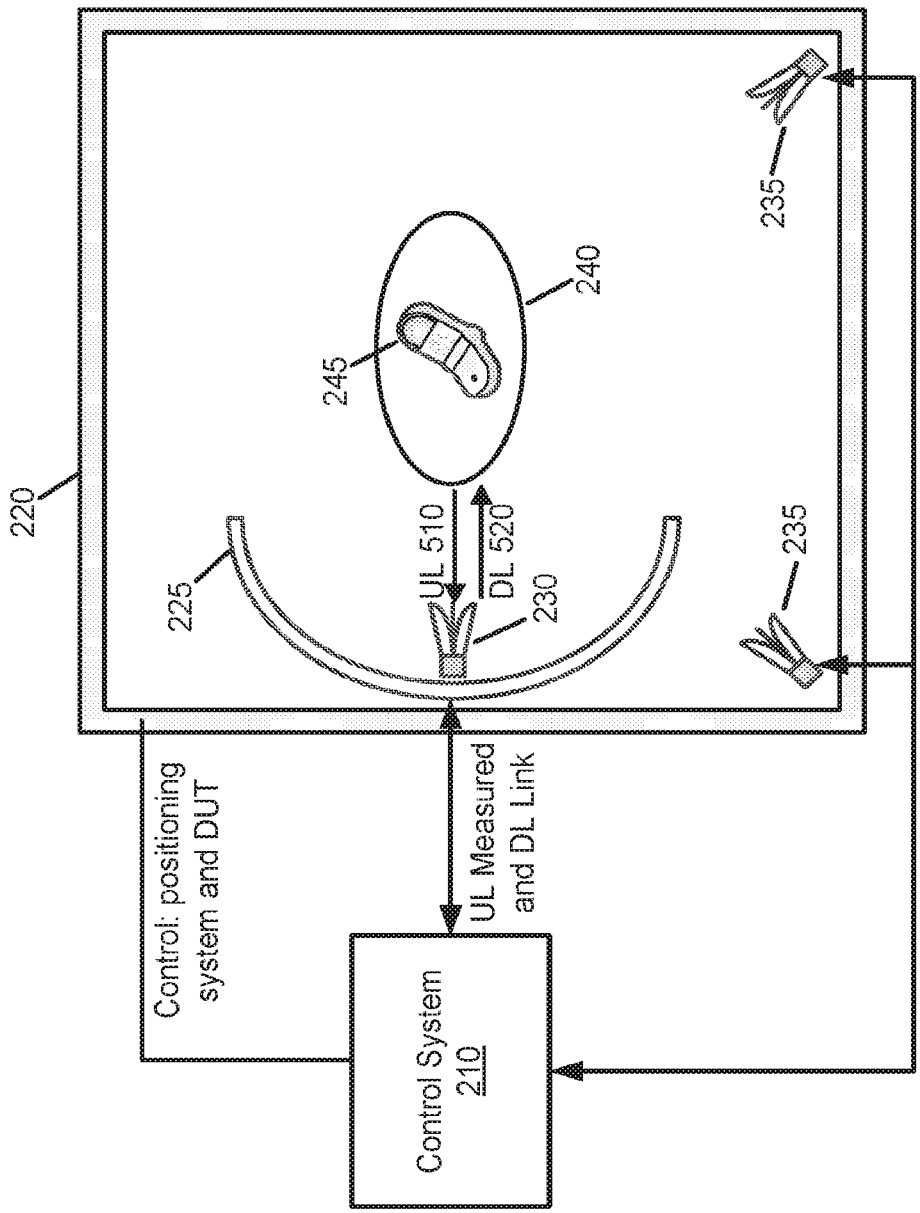

FIG. 5 is a diagram illustrating a third example configuration of test system 200 for testing UE transmissions. The configuration illustrated in FIG. 5 may be similar to the configuration illustrated in FIG. 3. As previously discussed, in the test configuration shown in FIG. 3, control system 21 controlled DUT 245 to dynamically adapt its transmission beam based on signals received from link antenna 230. In the configuration of FIG. 5, however, control system 210 may control DUT 245 to optimize its beam based on the initial beam angle and position of DUT 245, and to fix the initially optimized beam for the duration of the test (during which DUT 245 transmits in autonomous mode).

More particularly, as shown in FIG. 5, uplink signals 510 may be transmitted from DUT 245 to measuring antenna 225. The measured signal, received from DUT 245, may be processed and recorded by control system 210. Downlink signals 520 may be transmitted via the co-located link antenna 230. Results describing the downlink signals, as measured by DUT 245, may be transmitted back to control system 210 for storage and analysis. The transmission of the uplink and downlink signals 510 and 520, respectively, may be performed over a number of DUT 245 positions (i.e., control system 210 may control positioning system 240 to rotate to a number of predetermined positions, corresponding to different beam angles for DUT 245 with respect to measuring antenna 225 and link antenna 230) that may be controlled by control system 210. Transmissions by DUT 245, during a test, may be based on a beam angle that is initially optimized by an initial transmission via link antenna 230, wherein the beam angle is then not changed (i.e., not adaptively modified) as DUT 245 is rotated during a test. With the testing configuration of FIG. 5, the DUT transmitted beam angle (which is fixed) and the angle of measurement may not be the same. When in autonomous mode, DUT 245 and test equipment may not be able to maintain a bidirectional link over the Radio Access Technology (RAT) under test.

The testing configuration shown in FIG. 5 may be particularly suited to measuring FoMs relating to unwanted emissions and total radiated power of DUT 245. For a particular test, the set of beam angles and positions, for DUT 245, may be defined for each test (e.g., each standards requirement). For example, spurious emissions may be evaluated over a larger set of beam angles and positions than other tests.

Figure 6:
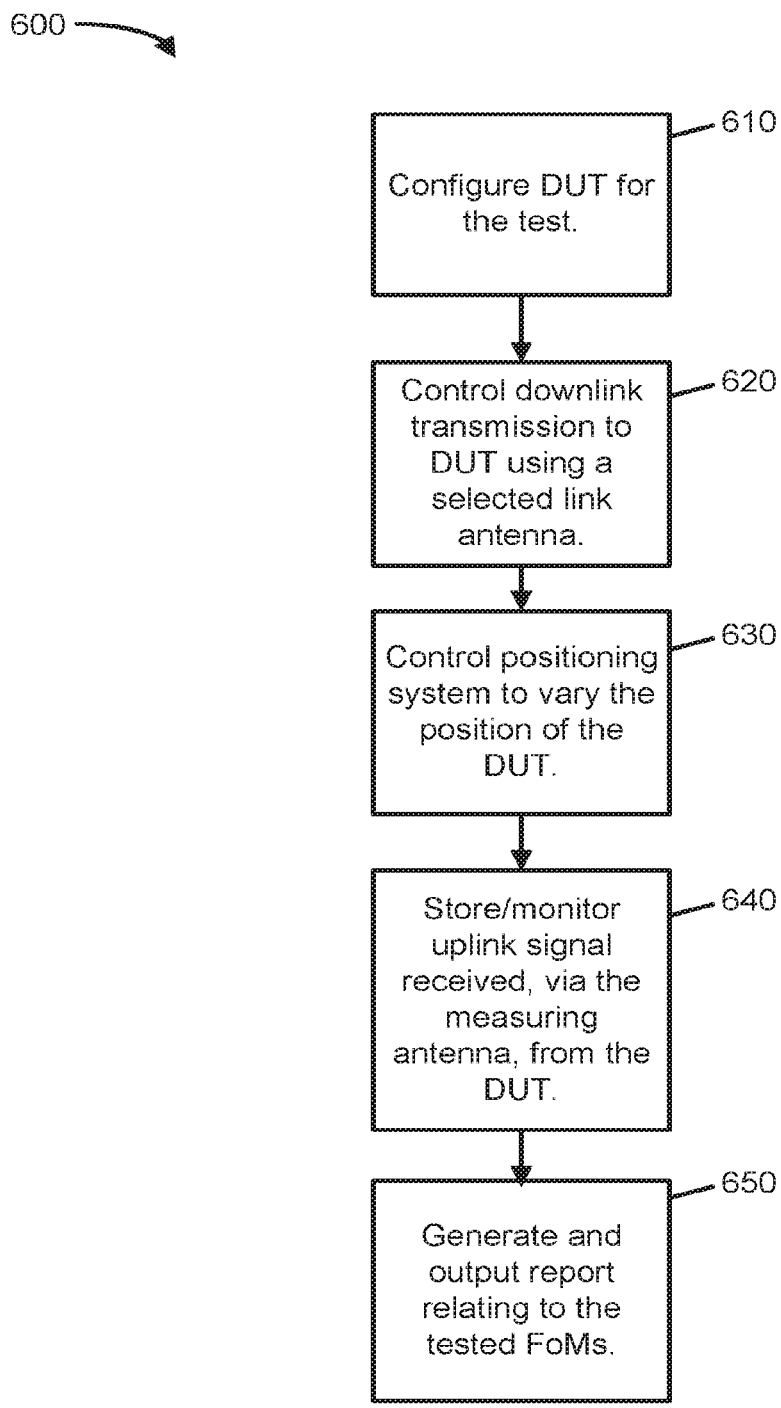
FIG. 6 is a flow chart illustrating an example process relating to the testing of User Equipments (UEs)

FIG. 6 is a flow chart illustrating an example process 600 relating to the testing of UEs (i.e., DUTs) using the testing configurations illustrated in FIGS. 3-5. Process 600 may be performed by, for example, control system 210.

Process 600 may include configuring the DUT for the test (block 610). For example, for the test configuration corresponding to FIG. 5, control system 210 may control DLT 245 so that the beamforming for the transmission beam is optimized based on an initial transmission to DUT 245, but then not subsequently changed as the DUT position is subsequently varied. As another example, for the test configuration corresponding to FIG. 3, control system 210 may control DUT 245 to dynamically adapt its transmission beam based on the current incoming transmission from link antenna 235. For the test configuration corresponding to FIG. 5, however, control system 210 may control DUT 245 to refrain from dynamically adapting its transmission beam based on the current incoming transmission from link antenna 235.

Process 600 may further include controlling the downlink transmission to the DUT using a selected link antenna(s) 230 and/or 235. For example, for the test configurations corresponding to FIGS. 3 and 5, only link antenna 230 may be used for the downlink. For the test configurations corresponding to FIG. 4, at various times during the test, different ones of link antennas 230 and 235 may be used. Control system 210 may, at the appropriate time for the test, control selection of the particular link antenna to use. In some testing configurations, multiple link antennas may be simultaneously used.

Process 600 may additionally include controlling positioning system 240 to vary the position (e.g., rotate over two axes) of DUT 245 (block 630). Different tests may be configured to be performed at a series of different positions for DUT 245. The rotation of DUT 245 may, fix example, be preconfigured to be at certain positions/angles over the course of the test. Control system 210 may control positioning system 240 to appropriately rotate DUT 245 to the desired positions.

Process 600 may additionally include storing/monitoring the uplink signal received, via the measuring antenna, from the DUT (block 640). As previously mentioned, various sensors, associated with control system 210, may be used to obtain power and/or signal quality metrics relating to the received uplink signal. Additionally, DUT 245 may transmit information to control system 210 (e.g., either wirelessly or through a wired interface), such as reports including power metrics, quality metrics, or other metrics relating to the signals received, by the DUT, from the link antenna(s).

Process 600 may further include generating and outputting, such as via a graphical interface, a report relating to FoMs that are being tested for each particular test (block 650). The report may be used, for example, to determine whether a particular UE or UE design meets the testing requirements of the 3GPP standards.

Figure 7:
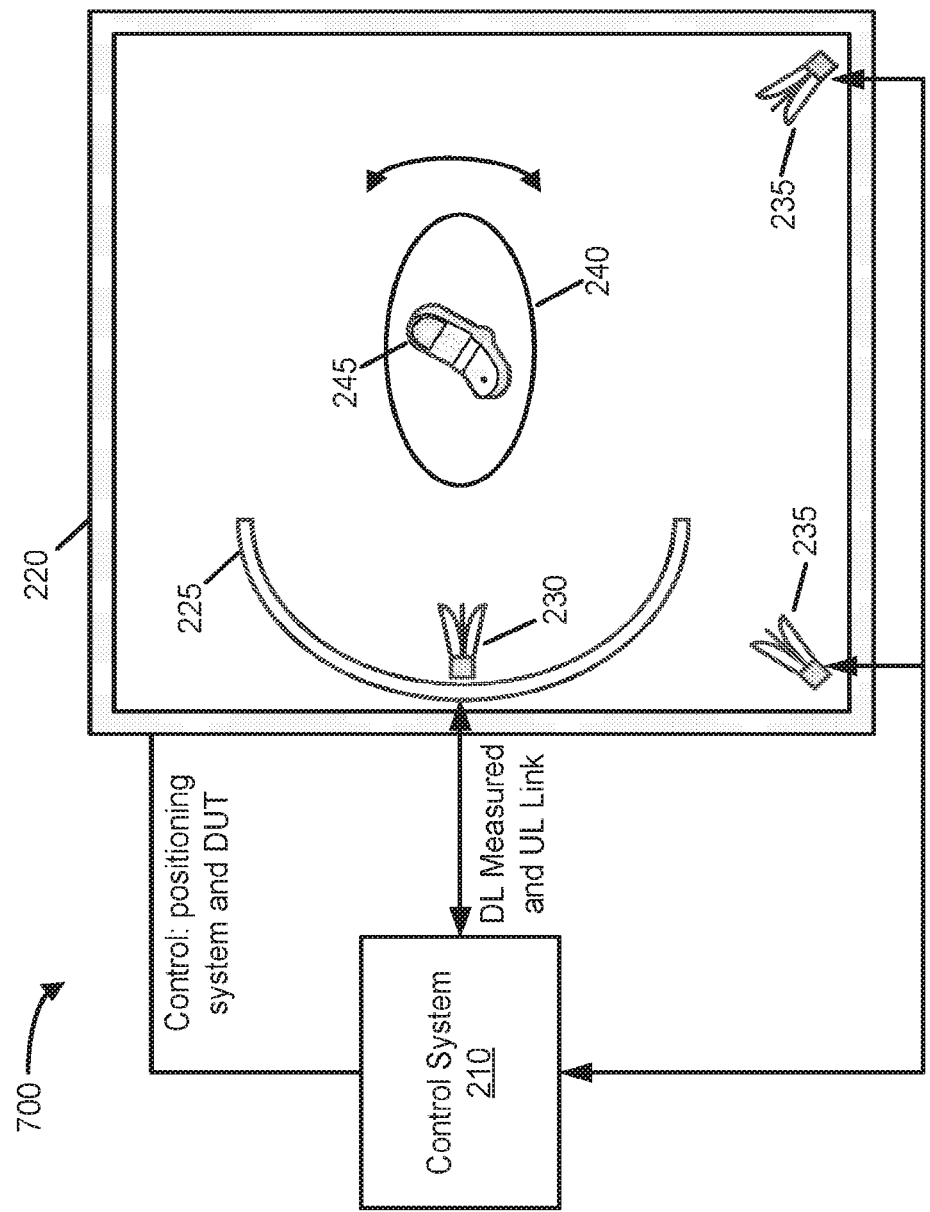
FIG. 7 is a diagram illustrating a testing system for testing the receiving of data for a DUT.

FIG. 7 is a diagram illustrating a testing system 700 for a DUT (e.g., UE 100). System 700 may be similar to system 200 (FIG. 2). System 700, however, may be used to test receiver characteristics of DUT 245. As shown, control system 210 may control the system to measure downlink transmissions (i.e., to receive downlink reporting information from DUT 245). In system 700, in certain tests, some of link antennas 230 and/or 235 may be controlled, by control system 210, to act as blocker antennas instead of link antennas. A blocker antenna may be controlled to emit radio signals that are to act as interference or noise to DUT 245. For example, link antenna 230 may be controlled as a downlink antenna and antennas 235 controlled to emit radio signals used to test the performance of DUT 245 in the presence of interference.

Figure 8:
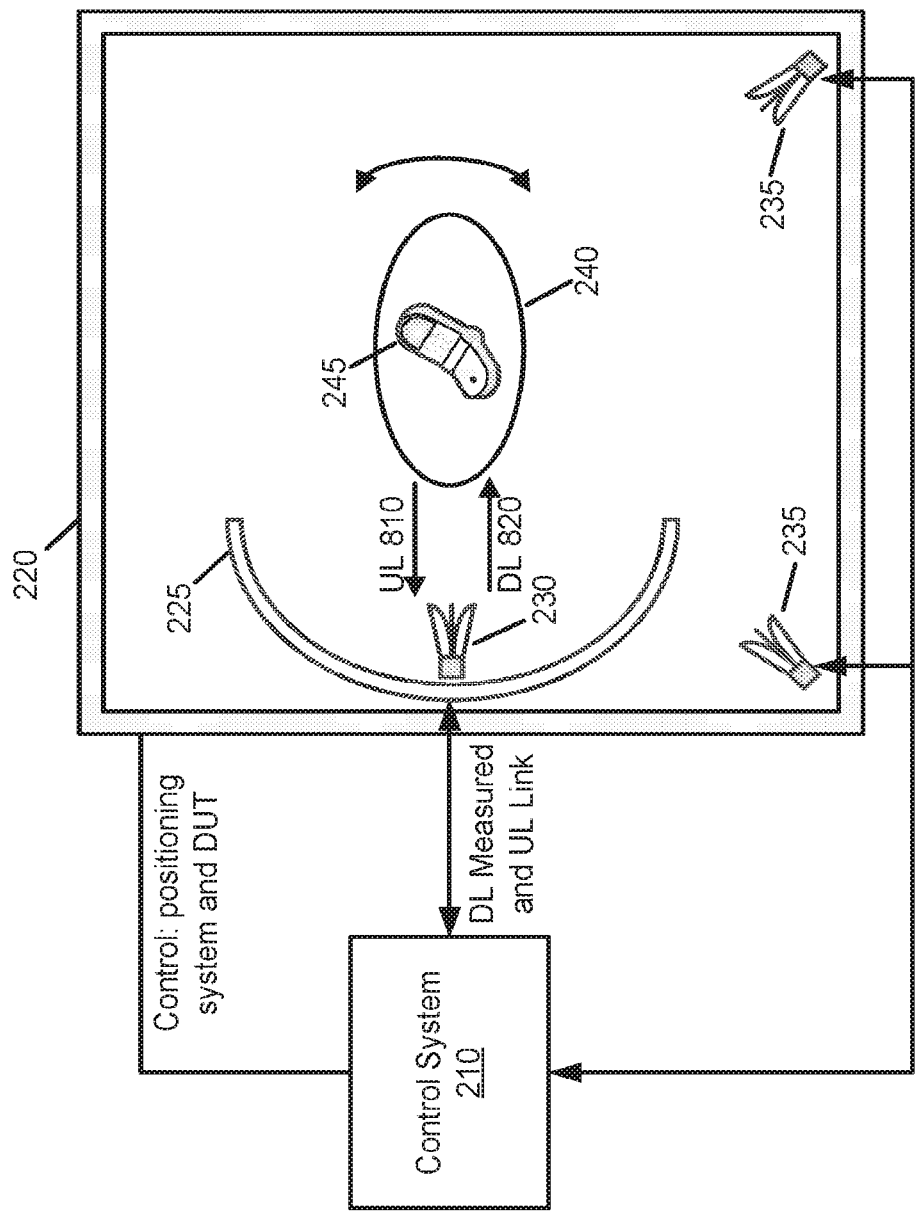
FIGS. 8-10 are diagrams illustrating example testing configurations for the system of FIG. 6.

FIG. 8 is a diagram illustrating a first example configuration of test system 700 for testing UE reception. In this embodiment, uplink signals 810 may be transmitted from DUT 245 to measuring antenna 225. Downlink signals 820 may be transmitted via the co-located link antenna 230. Results describing the downlink signals, as measured by DUT 245, may be transmitted back to control system 210 for storage and analysis. The transmission of the downlink signal 810, formed over a number of DUT 245 positions (i.e., control system 210 may control positioning system 240 to rotate to a number of predetermined positions, corresponding to different beam angles for DUT 245 with respect to measuring antenna 225 and link antenna 230) may be controlled by control system 210.

With the system of FIG. 8, a number FoM testing metrics may be determined across a number of DUT 245 positions, which may correspond to a number of beam angles with respect to DUT 245. In one implementation, the FoMs may include: Reference Sensitivity (REFSENS), maximum input level, and Adjacent Channel Selectivity (ACS). REFSENS may relate to over the air sensitivity levels of the DUT. The maximum input level may refer to the maximum power level received at the DUT. ACS is a measure of the DUT's ability to suppress out-of-band interfering signals.

For each required FoM that is to be measured, the set of DUT beam angles and DUT positions may be predefined. For example, REFSENS may be evaluated over a larger set of beam angles and positions than other requirements. Some requirements may be evaluated at a single beam angle across a small number of DUT positions.

In some implementations, control system 210 may control DUT 245 to dynamically adapt its beam to the link antenna.

Figure 9:
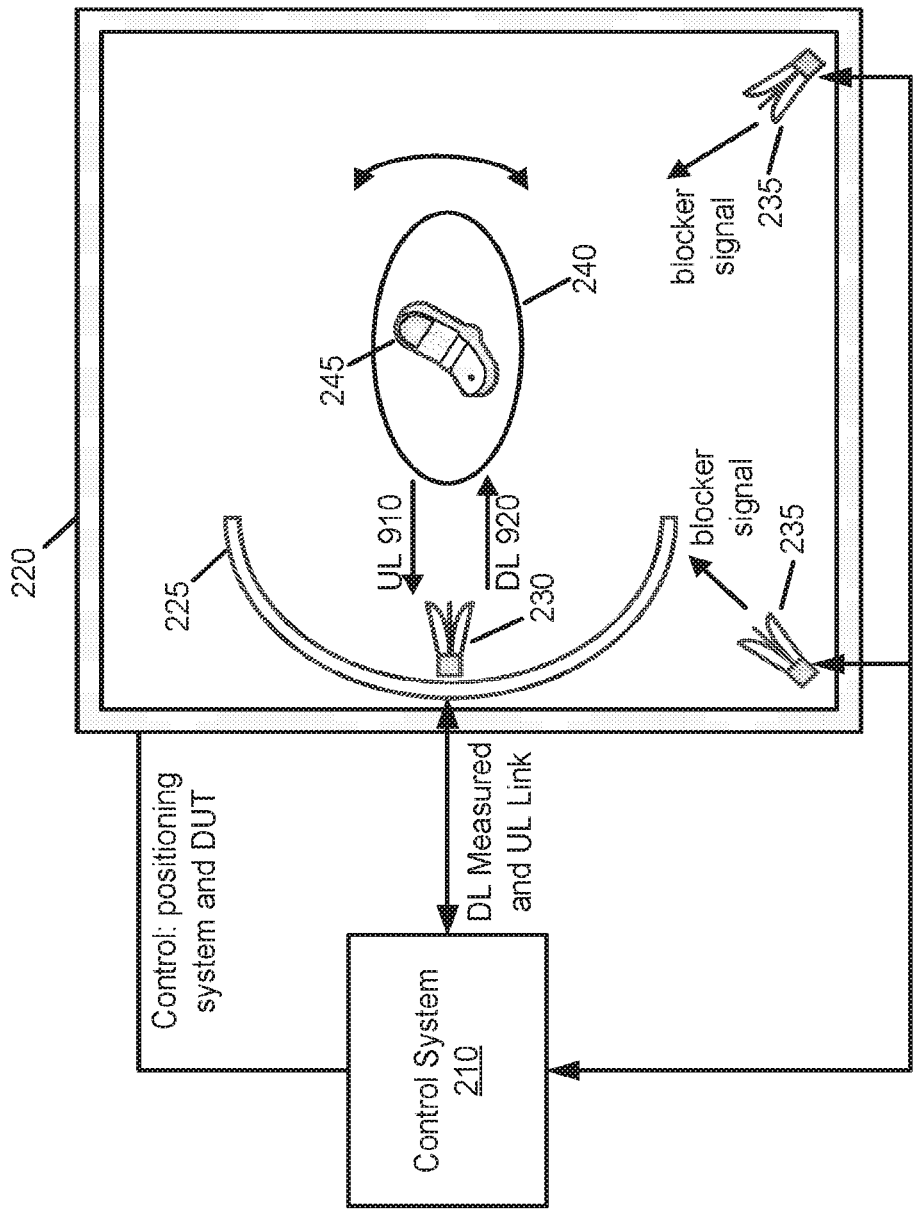

FIG. 9 is a diagram illustrating a second example configuration of test system 700 for testing UE reception. In this embodiment, uplink signals 910 may be transmitted from DUT 245 to measuring antenna 225 and downlink signals 920 may be transmitted via link antenna 230 to DUT 245. Additionally, one of link antennas 235 may be controlled as a blocker antenna. Positioning system 240 may be controlled to rotate DUT 240 and thus to measure the desired FoMs across a number of DUT beam angles and positions.

With the system of FIG. 9, the measured FoMs may include ACS and blocking. Blocking characteristics of a DUT may generally relate to the ability of a receiver to appropriately demodulate signals in the presence of a range of interference and/or high-power signals. Control system may thus control measuring antenna 225, various ones of link antennas 235, and positioning system 240 to satisfy each requirement test.

The set of DUT beam angles and DUT positions may be defined for each FoM requirement. For example, spurious emissions may be evaluated over a larger set of beam angles and positions than other requirements. Control system 210 may control DUT 245 to dynamically adapt its beam to the activated link antenna dynamically. In this configuration, the DUT received beam angle and the angle of measurement may not be the same.

Figure 10:
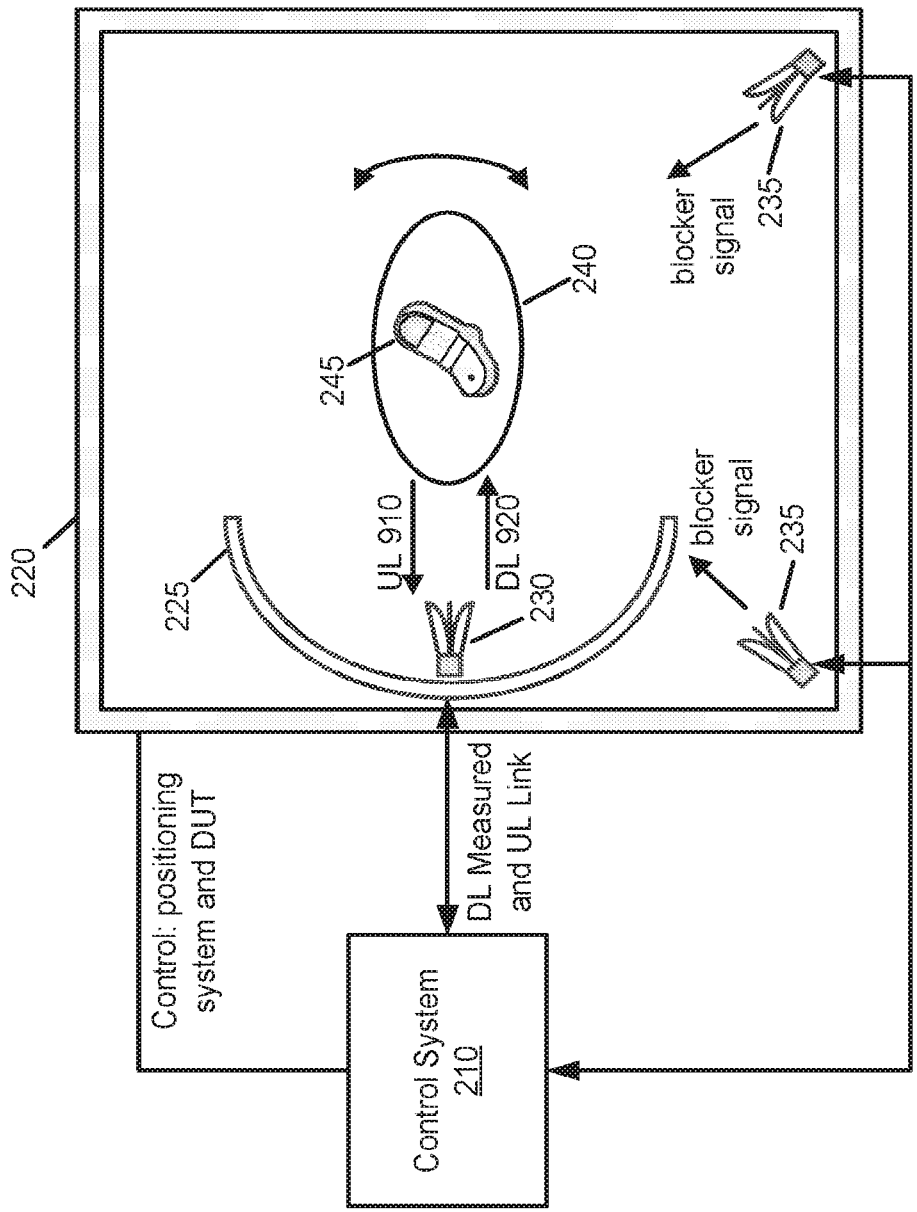

FIG. 10 is a diagram illustrating a third example configuration of test system 700 for testing UE receptions. The configuration illustrated in FIG. 10 may be similar to the configuration illustrated in FIG. 8 in which both the downlink measured signal and the uplink signal are communicated using measurement antenna 225 and co-located antenna 230 across a number of DUT angle beams and over a number of DUT positions. However, in the configuration of FIG. 10, control system 210 may control DUT 245 to optimize its beam based on the initial beam angle and position of DUT 245, and to fix the initially optimized beam for the duration of the test (during which DUT 245 receives in autonomous mode). In this configuration the DUT received beam angle (which is fixed) and the angle of measurement are not the same in this test. When the DUT is in autonomous mode, the DUT and control system 210 may not be able to maintain a bidirectional link over the RAT under test.

With the system of FIG. 10, the FoM of total radiated sensitivity may be measured. A set of DUT beam angles and DUT positions may be defined for the FoM.

The operation of the test configuration discussed with respect to FIGS. 8-10 may be similar to that operations discussed with respect to process 600 (FIG. 6), except that the values relating to the downlink signals, as received and measured by DUT 245, may be used to generate and output the reports relating to the tested FoMs.

As used herein, the term "circuitry," "processing circuitry," or "logic" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Figure 11:
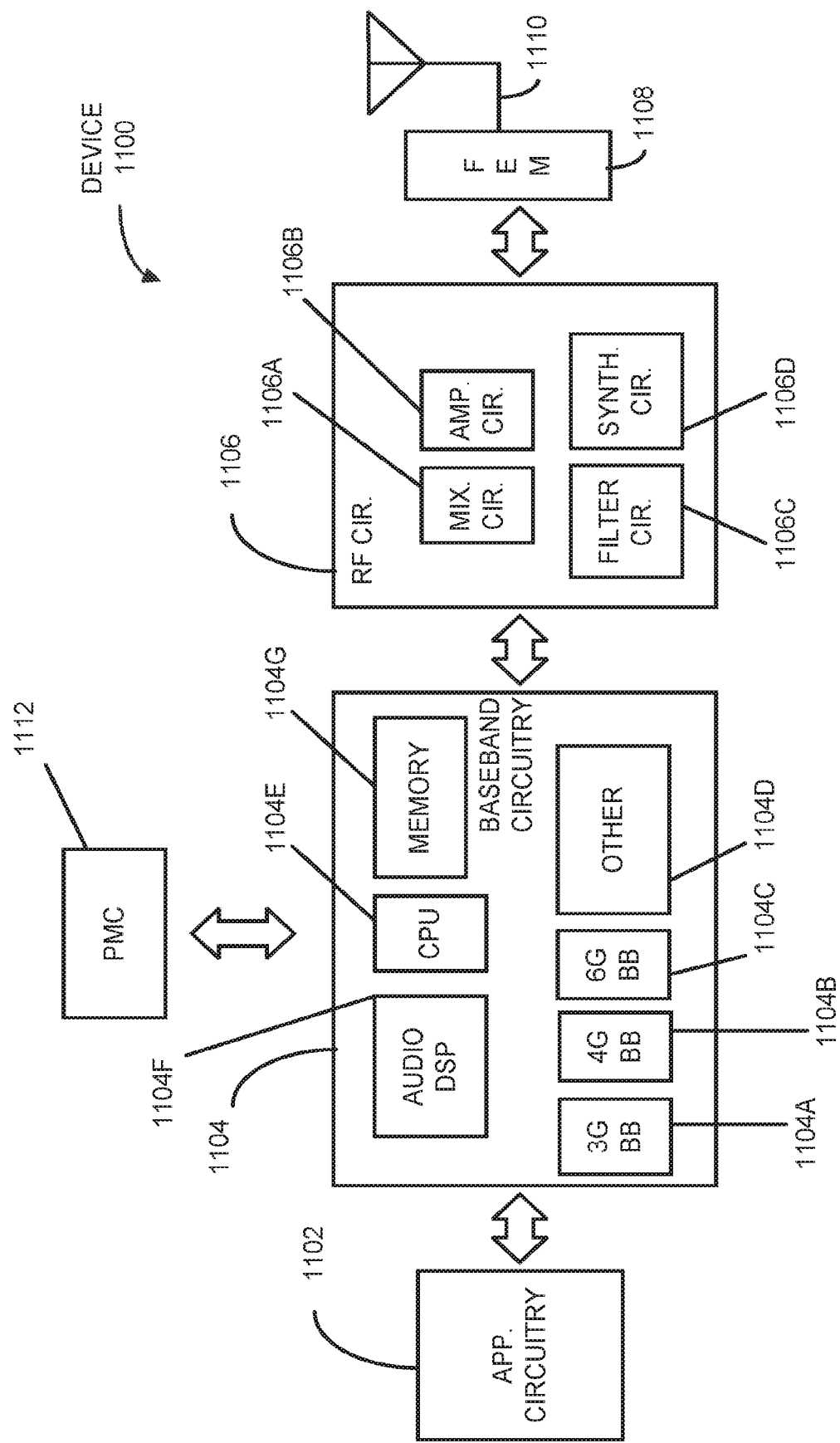
FIG. 11 illustrates example components of a device in accordance with some embodiments.

FIG. 11 illustrates example components of a device 1100 in accordance with some embodiments. In some embodiments, the device 1100 may include application circuitry 1102, baseband circuitry 1104, Radio Frequency (RF) circuitry 1106, from-end module (FEM) circuitry 1108, one or more antennas 1110, and power management circuitry (PMC) 1112 coupled together at least as shown. The components of the illustrated device 1100 may be included in a UE or a RAN node. In some embodiments, the device 1100 may include less elements (e.g., a RAN node may not utilize application circuitry 1102, and instead include a processor/controller to process IP data received from an EPC). In some embodiments, the device 1100 may include additional elements such as, for example, memory/storage, display, camera, sensor, or input/output (I/O) interface. In other embodiments, the components described below may be included in more than one device (e.g., said circuitries may be separately included in more than one device for Cloud-RAN (C-RAN) implementations).

The application circuitry 1102 may include one or more application processors. For example, the application circuitry 1102 may include circuitry such as, but not limited to, one or more single-core or multi-core processors. The processor(s) may include any combination of general-purpose processors and dedicated processors (e.g., graphics processors, application processors, etc.). The processors may be coupled with or may include memory/storage and may be configured to execute instructions stored in the memory/storage to enable various applications or operating systems to run on the device 1100. In some embodiments, processors of application circuitry 1102 may process IP data packets received from an EPC.

The baseband circuitry 1104 may include circuitry such as, but not limited to, one or more single-core or multi-core processors. The baseband circuitry 1104 may include one or more baseband processors or control logic to process baseband signals received from a receive signal path of the RF circuitry 1106 and to generate baseband signals for a transmit signal path of the RF circuitry 1106. Baseband processing circuity 1104 may interface with the application circuitry 1102 for generation and processing of the baseband signals and for controlling operations of the RF circuitry 1106. For example, in some embodiments, the baseband circuitry 1104 may include a third generation (3G) baseband processor 1104A, a fourth generation (4G) baseband processor 1104B, a fifth generation (5G) baseband processor 1104C, or other baseband processor(s) 1104D for other existing generations, generations in development or to be developed in the future (e.g., second generation (2G), sixth generation (6G), etc.). The baseband circuitry 1104 (e.g., one or more of baseband processors 1104A-D) may handle various radio control functions that enable communication with one or more radio networks via the RF circuitry 1106. In other embodiments, some or all of the functionality of baseband processors 1104A-D may be included in modules stored in the memory 1104*6* and executed via a Central Processing Unit (CPU) 1104E. The radio control functions may include, but are not limited to, signal modulation/demodulation, encoding/decoding, radio frequency shifting, etc. In some embodiments, modulation/demodulation circuitry of the baseband circuitry 1104 may include Fast-Fourier Transform (FFT), precoding, or constellation mapping/demapping functionality. In some embodiments, encoding/decoding circuitry of the baseband circuitry 1104 may include convolution, tail-biting convolution, turbo. Viterbi, or Low-Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 1104 may include one or more audio digital signal processor(s) (DSP) 1104F. The audio DSP(s) 1104F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 1104 and the application circuitry 1102 may be implemented together such as, for example, on a system on a chip (SOC).

In some embodiments, the baseband circuitry 1104 may provide for communication compatible with one or more radio technologies. For example, in some embodiments, the baseband circuitry 1104 may support communication with an evolved universal terrestrial radio access network (EUTRAN) or other wireless metropolitan area networks (WMAN), a wireless local area network (WLAN), a wireless personal area network (WPAN). Embodiments in which the baseband circuitry 1104 is configured to support radio communications of more than one wireless protocol may be referred to as multi-mode baseband circuitry.

RF circuitry 1106 may enable communication with wireless networks using modulated electromagnetic radiation through a non-solid medium. In various embodiments, the RF circuitry 1106 may include switches, filters, amplifiers, etc. to facilitate the communication with the wireless network. RF circuitry 1106 may include a receive signal path which may include circuitry to down-convert RF signals received from the FEM circuitry 1108 and provide baseband signals to the baseband circuitry 1104. RF circuitry 1106 may also include a transmit signal path which may include circuitry to up-convert baseband signals provided by the baseband circuitry 1104 and provide RF output signals to the FEM circuitry 1108 for transmission.

In some embodiments, the receive signal path of the RF circuitry 1106 may include mixer circuitry 1106*a*, amplifier circuitry 1106*b* and filter circuitry 1106*c*. In some embodiments, the transmit signal path of the RF circuitry 1106 may include filter circuitry 1106*c* and mixer circuitry 1106*a*. RF circuitry 1106 may also include synthesizer circuitry 1106*d* for synthesizing a frequency for use by the mixer circuitry 1106*a* of the receive signal path and the transmit signal path. In some embodiments, the mixer circuitry 1106*a* of the receive signal path may be configured to down-convert RF signals received from the FEM circuitry 1108 based on the synthesized frequency provided by synthesizer circuitry 1106*d*. The amplifier circuitry 1106*b* may be configured to amplify the down-converted signals and the filter circuitry 1106*c* may be a low-pass filter (LPF) or band-pass filter (BPF) configured to remove unwanted signals from the down-converted signals to generate output baseband signals. Output baseband signals may be provided to the baseband circuitry 1104 for further processing. In some embodiments, the output baseband signals may be zero-frequency baseband signals, although this is not a requirement. In some embodiments, mixer circuitry 1106*a* of the receive signal path may comprise passive mixers, although the scope of the embodiments is not limited in this respect.

In some embodiments, the mixer circuitry 1106*a* of the transmit signal path may be configured to up-convert input baseband signals based on the synthesized frequency provided by the synthesizer circuitry 1106*d* to generate RF output signals for the FEM circuitry 1108. The baseband signals may be provided by the baseband circuitry 1104 and may be filtered by filter circuitry 1106*c*.

In some embodiments, the mixer circuitry 1106*a* of the receive signal path and the mixer circuitry 1106*a* of the transmit signal path may include two or more mixers and may be arranged for quadrature downconversion and upconversion, respectively. In some embodiments, the mixer circuitry 1106*a* of the receive signal path and the mixer circuitry 1106*a* of the transmit signal path may include two or more mixers and may be arranged for image rejection (e.g., Hartley image rejection). In some embodiments, the mixer circuitry 1106*a* of the receive signal path and the mixer circuitry 1106*a* may be arranged for direct downconversion and direct upconversion, respectively. In some embodiments, the mixer circuitry 1106*a* of the receive signal path and the mixer circuitry 1106*a* of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RE circuitry 1106 may include analog-to-digital converter (ADC) and digital-to-analog converter (DAC) circuitry and the baseband circuitry 1104 may include a digital baseband interface to communicate with the RE circuitry 1106.

In some dual-mode embodiments, a separate radio IC circuitry may be provided for processing signals for each spectrum, although the scope of the embodiments is not limited in this respect.

In some embodiments, the synthesizer circuitry 1106*d* may be a fractional-N synthesizer or a fractional N/N+1 synthesizer, although the scope of the embodiments is not limited in this respect as other types of frequency synthesizers may be suitable. For example, synthesizer circuitry 1106*d* may be a delta-sigma synthesizer, a frequency multiplier, or a synthesizer comprising a phase-locked loop with a frequency divider.

The synthesizer circuitry 1106*d* may be configured to synthesize an output frequency for use by the mixer circuitry 1106*a* of the RE circuitry 1106 based on a frequency input and a divider control input. In some embodiments, the synthesizer circuitry 1106d may be a fractional N/N+1 synthesizer.

In some embodiments, frequency input may be provided by a voltage controlled oscillator (VCO), although that is not a requirement. Divider control input may be provided by either the baseband circuitry 1104 or the applications processor 1102 depending on the desired output frequency. In some embodiments, a divider control input (e.g., N) may be determined from a look-up table based on a channel indicated by the applications processor 1102. Synthesizer circuitry 1106d of the RF circuitry 1106 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 1106d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 1106 may include an IQ/polar converter.

FEM circuitry 1108 may include a receive signal path which may include circuitry configured to operate on RF signals received from one or more antennas 1110, amplify the received signals and provide the amplified versions of the received signals to the RF circuitry 1106 for further processing. FEM circuitry 1108 may also include a transmit signal path which may include circuitry configured to amplify signals for transmission provided by the RF circuitry 1106 for transmission by one or more of the one or more antennas 1110. In various embodiments, the amplification through the transmit or receive signal paths may be done solely in the RF circuitry 1106, solely in the FEM 1108, or in both the RF circuitry 1106 and the FEM 1108.

In some embodiments, the FEM circuitry 1108 may include a TX/RX switch to switch between transmit mode and receive mode operation. The FEM circuitry may include a receive signal path and a transmit signal path. The receive signal path of the FEM circuitry may include an LNA to amplify received RF signals and provide the amplified received RF signals as an output (e.g., to the RF circuitry 1106). The transmit signal path of the FEM circuitry 1108 may include a power amplifier (PA) to amplify input RF signals (e.g., provided by RF circuitry 1106), and one or more filters to generate RF signals for subsequent transmission (e.g., by one or more of the one or more antennas 1110).

In some embodiments, the PMC 1112 may manage power provided to the baseband circuitry 1104. In particular, the PMC 1112 may control power-source selection, voltage scaling, battery charging, or DC-to-DC conversion. The PMC 1112 may often be included when the device 1100 is capable of being powered by a battery, for example, when the device is included in a UE. The PMC 1112 may increase the power conversion efficiency while providing desirable implementation size and heat dissipation characteristics.

While FIG. 11 shows the PMC 1112 coupled only with the baseband circuitry 1104. However, in other embodiments, the PMC 1112 may be additionally or alternatively coupled with, and perform similar power management operations for, other components such as, but not limited to, application circuitry 1102, RF circuitry 1106, or FEM 1108.

In some embodiments, the PMC 1112 may control, or otherwise be part of, various power saving mechanisms of the device 1100. For example, if the device 1100 is in an RRC_Connected state, where it is still connected to the RAN node as it expects to receive traffic shortly, then it may enter a state known as Discontinuous Reception Mode (DRX) after a period of inactivity. During this state, the device 1100 may power down for brief intervals of time and thus save power.

If there is no data traffic activity for an extended period of time, then the device 1100 may transition off to an RRC_Idle state, where it disconnects from the network and does not perform operations such as channel quality feedback, handover, etc. The device 1100 goes into a very low power state and it performs paging where again it periodically wakes up to listen to the network and then powers down again. The device 1100 may not receive data in this state, in order to receive data, it must transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of the application circuitry 1102 and processors of the baseband circuitry 1104 may be used to execute elements of one or more instances of a protocol stack. For example, processors of the baseband circuitry 1104, alone or in combination, may be used execute Layer 3, Layer 2, or Layer 1 functionality, while processors of the application circuitry 1104 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

Figure 12:
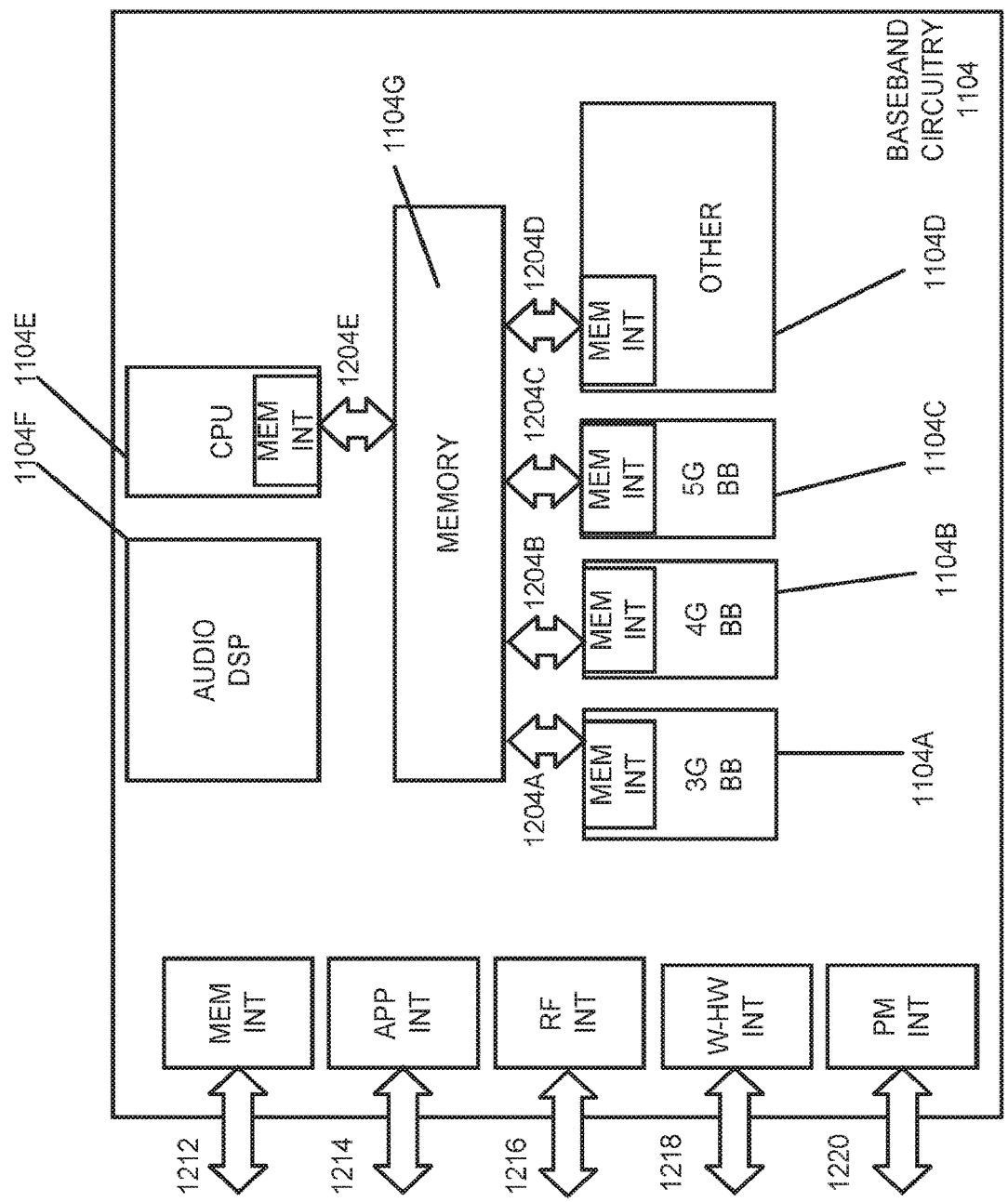
FIG. 12 illustrates example interfaces of baseband circuitry in accordance with some embodiments.

FIG. 12 illustrates example interfaces of baseband circuitry in accordance with some embodiments. As discussed above, the baseband circuitry 1104 of FIG. 11 may comprise processors 1104A-504E and a memory 1104G utilized by said processors. Each of the processors 1104A-504E may include a memory interface, 1204A-604E, respectively, to send/receive data to/from the memory 1104G.

The baseband circuitry 1104 may further include one or more interfaces to communicatively couple to other circuitries/devices, such as a memory interface 1212 (e.g., an interface to send/receive data to/from memory external to the baseband circuitry 1104), an application circuitry interface 1214 (e.g., an interface to send/receive data to/from the application circuitry 1102 of FIG. 11), an RF circuitry interface 1216 (e.g., an interface to send/receive data to/from RE; circuitry 1106 of FIG. 11), a wireless hardware connectivity interface 1218 (e.g., an interface to send/receive data to/from Near Field Communication (NFC) components, Bluetooth® components (e.g., Bluetooth® Low Energy), Wi-Fi® components, and other communication components), and a power management interface 1220 (e.g., an interface to send/receive power or control signals to/from the PMC 1112. RF circuitry interface 1216 may particularly include a first interface to a radio designed to communicate via an LTE link and a second interface to a radio designed to communicate via a WLAN/WiFi) link.

Figure 13:
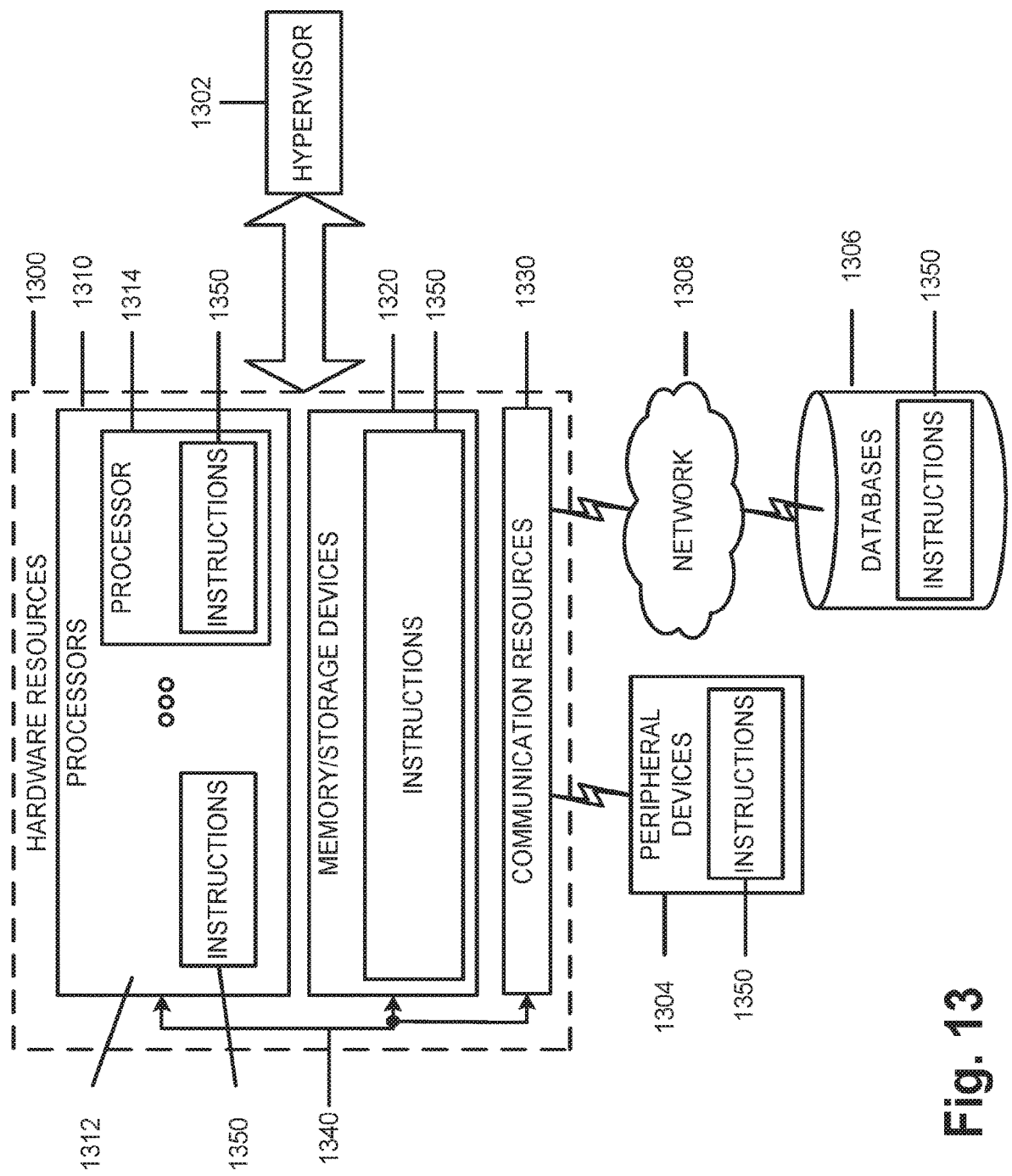
FIG. 13 is a block diagram illustrating components, according to some example embodiments, able to read instructions from a machine-readable or computer-readable medium (e.g., a non-transitory machine-readable storage medium) and perform any one or more of the methodologies discussed herein.

FIG. 13 is a block diagram illustrating components, according to some example embodiments, able to read instructions from a machine-readable or computer-readable medium (e.g., a non-transitory machine-readable storage medium) and perform any one or more of the methodologies discussed herein. Specifically, FIG. 13 shows a diagrammatic representation of hardware resources 1300 including one or more processors (or processor cores) 1310, one or more memory/storage devices 1320, and one or more communication resources 1330, each of which may be communicatively coupled via a bus 1340. For embodiments where node virtualization (e.g., NFV) is utilized, a hypervisor 1302 may be executed to provide an execution environment for one or more network slices/sub-slices to utilize the hardware resources 1300.

The processors 1310 (e.g., a central processing unit (CPU), a reduced instruction set computing (RISC) processor, a complex instruction set computing (CISC) processor, a graphics processing unit (GPU), a digital signal processor (DSP) such as a baseband processor, an application specific integrated circuit (ASIC), a radio-frequency integrated circuit (RFIC), another processor, or any suitable combination thereof) may include, for example, a processor 1312 and a processor 1314.

The memory/storage devices 1320 may include main memory, disk storage, or any suitable combination thereof. The memory/storage devices 1320 may include, but are not limited to any type of volatile or non-volatile memory such as dynamic random-access memory (DRAM), static random-access memory (SRAM), erasable programmable read-only memory (EPROM), electrically erasable programmable read-only memory (EEPROM), Flash memory, solid-state storage, etc.

The communication resources 1330 may include interconnection or network interface components or other suitable devices to communicate with one or more peripheral devices 1304 or one or more databases 1306 via a network 1308. For example, the communication resources 1330 may include wired communication components for coupling via a Universal Serial Bus (USB)), cellular communication components, NFC components, Bluetooth® components (e.g., Bluetooth® Low Energy), Wi-Fi® components, and other communication components.

Instructions 1350 may comprise software, a program, an application, an applet, an app, or other executable code for causing at least any of the processors 1310 to perform any one or more of the methodologies discussed herein. The instructions 1350 may reside, completely or partially, within at least one of the processors 1310 (e.g., within the processor's cache memory), the memory/storage devices 1320, or any suitable combination thereof. Furthermore, any portion of the instructions 1350 may be transferred to the hardware resources 1300 from any combination of the peripheral devices 1304 or the databases 1306. Accordingly, the memory of processors 1310, the memory/storage devices 1320, the peripheral devices 1304, and the databases 1306 are examples of computer-readable and machine-readable media.

A number of examples, relating to implementations of the techniques described above, will next be given.

In a first example, a control system may control a far-field anechoic test chamber for a User Equipment (UE) device. The control system may comprise: a computer-readable medium containing program instructions; and one or more processors to execute the program instructions to: control the UE to operate in a mode in which the UE adaptively optimizes an uplink beam of the UE based on received downlink signals; control a positioning device, located within the test chamber, to rotate the UE through a plurality of positions; and receive measurements relating to a plurality of Figures of Merit (FoM) for uplink communications from the UE at a plurality of the positions controlled by the positioning device, the uplink communications being received through an uplink antenna, associated with the test chamber, that is co-located with respect to an active downlink antenna, wherein the FoMs are selected from the set including: maximum output power of the UE, minimum output power of the UE, and adjacent channel leakage power ratio (ACLR).

In example 2, the subject matter of example 1, wherein the one or more processors are further to execute the program instructions to: receive second measurements relating to a second set of FoMs, the second measurements being obtained through the uplink antenna and using one or more second downlink antennas, the second downlink antennas being spatially distributed in the test chamber, wherein the second set of FoMs relate to: unwanted emissions, and ACLR.

In example 3, the subject matter of example 2 or any of the examples herein, wherein the one or more processors are further to execute the program instructions to: control the UE to operate in a mode in which the UE initially adaptively optimizes the uplink beam of the UE based on the received downlink signals and then fixes the uplink beam for subsequent measurements; receive third measurements relating to a third set of FoMs, the third measurements being obtained through the uplink antenna, using the co-located downlink antenna, and based on the fixed uplink beam, wherein the third set of FoMs relate to: unwanted emissions, and total radiated power.

In example 4, the subject matter of example 2, or 3, or any of the examples herein, wherein the positioning device rotates the UE over two-axis of freedom within the test chamber.

In example 5, the subject matter of example 1, 2, or 3, or any of the examples herein, wherein the UE includes a 5G New Radio (NR).

In a sixth example, a control system may control a far-field anechoic test chamber for a User Equipment (UE) device. The control system may comprise a computer-readable medium containing program instructions; and one or more processors to execute the program instructions to: control the UE to operate in a mode in which the UE adaptively optimizes an uplink beam of the UE based on received downlink signals; control a positioning device, located within the test chamber, to rotate the UE through a plurality of positions; and receive measurements relating to a plurality of Figures of Merit (FoM) for downlink communications to the UE at a plurality of the positions controlled by the positioning device, the downlink communications being transmitted through a downlink antenna, associated with the test chamber, that is co-located with respect to an uplink measurement antenna, wherein the FoMs are selected from the set including: Reference Sensitivity (REFSENS), maximum input level, and Adjacent Channel Selectivity (ACS).

In example 7, the subject matter of example 6 or any of the examples herein, wherein the one or more processors are further to execute the program instructions to: receive second measurements relating to second set of FoMs, the second measurements being obtained by additionally using one or more second downlink antennas, as blocker antennas, to transmit interference, wherein the second set of FoMs relate to: ACS, and blocking related measurements.

In example 8, the subject matter of example 7, or any of the examples herein, wherein the one or more processors are further to execute the program instructions to: control the UE to operate in a mode in which the UE initially adaptively optimizes the uplink beam of the UE based on the received downlink signals and then fixes the uplink beam for subsequent measurements; receive third measurements relating to third set of FoMs, wherein the third set of FoMs relate to total radiated sensitivity.

In example 9, the subject matter of example 5, 6, or 7, or any of the examples herein, wherein the positioning device rotates the LTE over two-axis of freedom within the test chamber.

In example 10, the subject matter of example 5, 6, or 7, or any of the examples herein, wherein the UE includes a 5G New Radio (NR).

In an $11^{th}$ example, a testing system for a wireless communication device may comprise: an anechoic far-field chamber; a measurement antenna positioned within the chamber; a first link antenna that is co-located, within the chamber, with the measurement antenna; a plurality of second link antennas that are spatially distributed within the chamber; a positioning system configured to mount the communication device and rotate the communication device through at least two-axis of freedom; and a control device to control operation of the measurement antenna, the first link antenna, the plurality of second link antennas, and the positioning system, to: receive measurements relating to a second plurality of FoMs for uplink communications from the wireless communication device, wherein the second plurality of FoMs are selected from the set including: maximum output power of the UE, minimum output power of the UE, adjacent channel leakage power ratio (ACLR), unwanted emissions, and total radiated power.

In example 12, the subject matter of example 11 or any of the examples herein, wherein the control device is further to control operation of the measurement antenna, the first link antenna, the plurality of second link antennas, and the positioning system, to: receive measurements relating to a plurality of Figures of Merit (FoM) for downlink communications to the wireless communication device, wherein the FoMs are selected from the set including: Reference Sensitivity (REFSENS), maximum input level, Adjacent Channel Selectivity (ACS), and total radiated sensitivity.

In example 13, the subject matter of example 12 or any of the examples herein, wherein during at least some of the FoMs, at least one of the plurality of second link antennas as controlled, as a blocking antenna, to emit interference.

In example 14, the subject matter of example 13 or any of the examples herein, wherein the plurality of second link antennas are individually controllable, by the control device, as either a blocking antenna or a downlink link antenna.

In example 15, the subject matter of example 11, 12, or 13, or any of the examples herein, wherein the wireless communication device includes a 5G New Radio (NR).

In example 16, the subject matter of example 11, 12, or 13, or any of the examples herein, wherein the control device connected to the communication device via a wired testing interface.

In example 17, the subject matter of example 11, 12, or 13, or any of the examples herein, wherein the communication device is mounted in the positioning system at or near the center of the test chamber.

In example 18, the subject matter of example 11, 12, or 13, or any of the examples herein, wherein the shape of the test chamber is generally spherical.

In example 19, the subject matter of example 11, 12, or 13, or any of the examples herein, wherein the control device is further to: control the communication device to operate in a mode in which the communication device initially adaptively optimizes beamforming parameters of an uplink beam of the communication device based on received downlink signals.

In example 20, the subject matter of example 19 or any of the examples herein, wherein the control device is further to: adaptively optimize the uplink beam based on initial downlink communications, and then fixes the beamforming parameters for subsequent communications.

In a $21^{st}$ example, a control system to control a far-field anechoic test chamber for a UE may comprise: means for controlling the UE to operate in a mode in which the UE adaptively optimizes an uplink beam of the UE based on received downlink signals; means for controlling a positioning device, located within the test chamber, to rotate the UE through a plurality of positions; and means for receiving measurements relating to a plurality of Figures of Merit (FoM) for uplink communications from the UE at a plurality of the positions controlled by the positioning device, the uplink communications being received through an uplink antenna, associated with the test chamber, that is co-located with respect to an active downlink antenna, wherein the FoMs are selected from the set including: maximum output power of the UE, minimum output power of the UE, and adjacent channel leakage power ratio (ACLR).

In example 22, the subject matter of example 21 or any of the examples herein, further comprising: means for receiving second measurements relating to a second set of FoMs, the second measurements being obtained through the uplink antenna and using one or more second downlink antennas, the second downlink antennas being spatially distributed in the test chamber, wherein the second set of FoMs relate to: unwanted emissions, and ACLR.

In example 20, the subject matter of example 19 or any of the examples herein, further comprising: means for controlling the UE to operate in a mode in which the UE initially adaptively optimizes the uplink beam of the UE based on the received downlink signals and then fixes the uplink beam for subsequent measurements; means for receiving third measurements relating to a third set of FoMs, the third measurements being obtained through the uplink antenna, using the co-located downlink antenna, and based on the fixed uplink beam, wherein the third set of FoMs relate to: unwanted emissions, and total radiated power.

In example 24, the subject matter of example 21, 22, or 23, or any of the examples herein, wherein the positioning device rotates the UE over two-axis of freedom within the test chamber.

In a example 25, the subject matter of example 21, 22, or 23, or any of the examples herein, wherein the UE includes a 5G New Radio (NR).

In a 26$^{th}$ example, a method for controlling a far-field anechoic test chamber for User Equipment (UE) comprises: controlling the UE to operate in a mode in which the UE adaptively optimizes an uplink beam of the UE based on received downlink signals; controlling a positioning device, located within the test chamber, to rotate the UE through a plurality of positions; and receiving measurements relating to a plurality of Figures of Merit (FoM) for uplink communications from the UE at a plurality of the positions controlled by the positioning device, the uplink communications being received through an uplink antenna, associated with the test chamber, that is co-located with respect to an active downlink antenna, wherein the FoMs are selected from the set including: maximum output power of the UE, minimum output power of the UE, and adjacent channel leakage power ratio (ACLR).

In example 27, the subject matter of example 26, or any of the examples herein, further comprising: receiving second measurements relating to a second set of FoMs, the second measurements being obtained through the uplink antenna and using one or more second downlink antennas, the second downlink antennas being spatially distributed in the test chamber, wherein the second set of FoMs relate to: unwanted emissions, and ACLR.

In example 28, the subject matter of example 26, or any of the examples herein, further comprising: controlling the UE to operate in a mode in which the UE initially adaptively optimizes the uplink beam of the UE based on the received downlink signals and then fixes the uplink beam for subsequent measurements; receiving third measurements relating to a third set of FoMs, the third measurements being obtained through the uplink antenna, using the co-located downlink antenna, and based on the fixed uplink beam, wherein the third set of FoMs relate to: unwanted emissions, and total radiated power.

In example 28, the subject matter of example 26, 26, or 28, or any of the examples herein, wherein the positioning device rotates the UE over two-axis of freedom within the test chamber.

In example 29, the subject matter of example 26, 27, or 28, or any of the examples herein, wherein the UE includes a 5G New Radio (NR).

In the preceding specification, various embodiments have been described with reference to the accompanying drawings, it will, however, be evident that various modifications and changes may be made thereto, and additional embodiments may be implemented, without departing from the broader scope as set forth in the claims that follow. The specification and drawings are accordingly to be regarded in an illustrative rather than restrictive sense.

For example, while series of signals and/or operations have been described with regard to FIG. 6, the order of the signals/operations may be modified in other implementations. Further, non-dependent signals may be performed in parallel.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code it being understood that software and control hardware could be designed to implement the aspects based on the description herein.

Even though particular combinations of features are recited in the claims and/or disclosed in the specification, these combinations are not intended to be limiting. In fact, many of these features may be combined in ways not specifically recited in the claims and/or disclosed in the specification.

No element, act, or instruction used in the present application should be construed as critical or essential unless explicitly described as such. An instance of the use of the term "and," as used herein, does not necessarily preclude the interpretation that the phrase "and/or" was intended in that instance. Similarly, an instance of the use of the term "or," as used herein, does not necessarily preclude the interpretation that the phrase "and/or" was intended in that instance. Also, as used herein, the article "a" is intended to include one or inure items, and may be used interchangeably with the phrase "one or more." Where only one item is intended, the terms "one," "single," "only," or similar language is used.

What is claimed is:

1. A control system to control a far-field anechoic test chamber for a User Equipment (UE) device, the control system comprising:
   a computer-readable medium containing program instructions; and
   one or more processors to execute the program instructions to:
      control the UE to operate in a mode in which the UE adaptively optimizes an uplink beam of the UE based on received downlink signals;
      control a positioning device, located within the test chamber, to rotate the UE through a plurality of positions; and
      receive measurements relating to a plurality of Figures of Merit (FoM) for uplink communications from the UE at a plurality of the positions controlled by the positioning device, the uplink communications being received through an uplink antenna, associated with the test chamber, that is co-located with respect to an active downlink antenna, wherein the FoMs are selected from the set including:
         maximum output power of the UE,
         minimum output power of the UE, and
         adjacent channel leakage power ratio (ACLR).

2. The control system of claim 1, wherein the one or more processors are further to execute the program instructions to:
   receive second measurements relating to a second set of FoMs, the second measurements being obtained through the uplink antenna and using one or more second downlink antennas, the second downlink antennas being spatially distributed in the test chamber, wherein the second set of FoMs relate to:
   unwanted emissions, and
   ACLR.

3. The control system of claim 2, wherein the one or more processors are further to execute the program instructions to:
   control the UE to operate in a mode in which the UE initially adaptively optimizes the uplink beam of the UE based on the received downlink signals and then fixes the uplink beam for subsequent measurements;
   receive third measurements relating to a third set of FoMs, the third measurements being obtained through the uplink antenna, using the co-located downlink antenna, and based on the fixed uplink beam, wherein the third set of FoMs relate to:

unwanted emissions, and
total radiated power.

4. The control system of claim 1, wherein the positioning device rotates the UE over two-axis of freedom within the test chamber.

5. The control system of claim 1, wherein the UE includes a 5G New Radio (NR).

6. A control system to control a far-field anechoic test chamber for a User Equipment (UE) device, the control system comprising:
  a computer-readable medium containing program instructions; and
  one or more processors to execute the program instructions to:
    control the UE to operate in a mode in which the UE adaptively optimizes an uplink beam of the UE based on received downlink signals;
    control a positioning device, located within the test chamber, to rotate the UE through a plurality of positions; and
    receive measurements relating to a plurality of Figures of Merit (FoM) for downlink communications to the UE at a plurality of the positions controlled by the positioning device, the downlink communications being transmitted through a downlink antenna, associated with the test chamber, that is co-located with respect to an uplink measurement antenna, wherein the FoMs are selected from the set including:
    Reference Sensitivity (REFSENS),
    maximum input level, and
    Adjacent Channel Selectivity (ACS).

7. The control system of claim 6, wherein the one or more processors are further to execute the program instructions to:
  receive second measurements relating to a second set of FoMs, the second measurements being obtained by additionally using one or more second downlink antennas, as blocker antennas, to transmit interference, wherein the second set of FoMs relate to:
    ACS, and
    blocking related measurements.

8. The control system of claim 7, wherein the one or more processors are further to execute the program instructions to:
  control the UE to operate in a mode in which the UE initially adaptively optimizes the uplink beam of the UE based on the received downlink signals and then fixes the uplink beam for subsequent measurements;
  receive third measurements relating to a third set of FoMs, wherein the third set of FoMs relate to total radiated sensitivity.

9. The control system of claim 6, wherein the positioning device rotates the UE over two-axis of freedom within the test chamber.

10. The control system of claim 6, wherein the UE includes a 5G New Radio (NR).

11. A testing system for a wireless communication device comprising:
  an anechoic far-field chamber;
  a measurement antenna positioned within the chamber;
  a first link antenna that is co-located, within the chamber, with the measurement antenna;
  a plurality of second link antennas that are spatially distributed within the chamber;
  a positioning system configured to mount the communication device and rotate the communication device through at least two-axis of freedom; and
  a control device to control operation of the measurement antenna, the first link antenna, the plurality of second link antennas, and the positioning system, to:
    receive measurements relating to a second plurality of FoMs for uplink communications from the wireless communication device, wherein the second plurality of FoMs are selected from the set including:
    maximum output power of the UE,
    minimum output power of the UE,
    adjacent channel leakage power ratio (ACLR),
    unwanted emissions, and
    total radiated power.

12. The testing system of claim 11, wherein the control device is further to control operation of the measurement antenna, the first link antenna, the plurality of second link antennas, and the positioning system, to:
  receive measurements relating to a plurality of Figures of Merit (FoM) for downlink communications to the wireless communication device, wherein the FoMs are selected from the set including:
  Reference Sensitivity (REFSENS),
  maximum input level,
  Adjacent Channel Selectivity (ACS), and
  total radiated sensitivity.

13. The testing system of claim 12, wherein during at least some of the FoMs, at least one of the plurality of second link antennas is controlled, as a blocking antenna, to emit interference.

14. The testing system of claim 13, wherein the plurality of second link antennas are individually controllable, by the control device, as either a blocking antenna or a downlink link antenna.

15. The control system of claim 11, wherein the wireless communication device includes a 5G New Radio (NR).

16. The control system of claim 11, wherein the control device is connected to the communication device via a wired testing interface.

17. The control system of claim 11, wherein the communication device is mounted in the positioning system at or near the center of the test chamber.

18. The control system of claim 11, wherein the shape of the test chamber is generally spherical.

19. The control system of claim 11, wherein the control device is further to:
  control the communication device to operate in a mode in which the communication device initially adaptively optimizes beamforming parameters of an uplink beam of the communication device based on received downlink signals.

20. The control system of claim 19, wherein the control device is further to:
  adaptively optimize the uplink beam based on initial downlink communications, and then fix the beamforming parameters for subsequent communications.

* * * * *